(12) United States Patent
Koh (10) Patent No.: US 7,064,369 B2
(45) Date of Patent: Jun. 20, 2006

(54) METHOD FOR MANUFACTURING A SEMICONDUCTOR DEVICE INCLUDING A PIP CAPACITOR AND A MOS TRANSISTOR

(75) Inventor: Kwan-Ju Koh, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/769,875

(22) Filed: Feb. 3, 2004

(65) Prior Publication Data

US 2004/0155277 A1    Aug. 12, 2004

(30) Foreign Application Priority Data

Feb. 4, 2003    (KR)    ............ 10-2003-0006989

(51) Int. Cl.
| | |
|---|---|
| H01L 27/108 | (2006.01) |
| H01L 29/76 | (2006.01) |
| H01L 29/94 | (2006.01) |
| H01L 31/119 | (2006.01) |
| H01L 27/01 | (2006.01) |
| H01L 21/8238 | (2006.01) |

(52) U.S. Cl. .............. 257/296; 257/303; 257/351; 257/379; 438/200; 438/210

(58) Field of Classification Search ........ 257/303, 257/351, 296, 379; 438/200, 210
See application file for complete search history.

(56) References Cited

U.S. PATENT DOCUMENTS

| 5,231,053 A | * | 7/1993 | Bost et al. | ............ 438/627 |
| 5,731,236 A | * | 3/1998 | Chou et al. | ............ 438/253 |
| 5,838,049 A | * | 11/1998 | Nicholls et al. | ......... 257/383 |
| 5,924,011 A | * | 7/1999 | Huang | .................... 438/655 |
| 5,973,346 A | * | 10/1999 | Pan | ........................ 257/303 |
| 6,284,594 B1 | * | 9/2001 | Ju et al. | ................ 438/250 |

* cited by examiner

*Primary Examiner*—Donghee Kang
*Assistant Examiner*—Samuel A Gebremariam
(74) *Attorney, Agent, or Firm*—Pillsbury Winthrop Shaw Pittman LLP

(57) ABSTRACT

In a method for fabricating a semiconductor device including a PIP capacitor and a MOS transistor, an isolator film is formed on a semiconductor substrate and then etched to expose an active region of the substrate. An epitaxial film is then formed by performing a selective epitaxial silicon growth process on the active region. A first polysilicon film, a dielectric film and a second polysilicon film are then sequentially formed. Next, an upper electrode is created by patterning the second polysilicon film. After a lower electrode and a gate electrode are formed by patterning the first polysilicon film, a source and a drain of a source/drain region are formed into the epitaxial film. Subsequently, after an interlayer insulation film is created on a resultant structure, contact holes are formed thereinto and contacts connected to the upper electrode, the lower electrode, the gate electrode and the source/drain region are formed.

12 Claims, 7 Drawing Sheets

METHOD FOR MANUFACTURING A SEMICONDUCTOR DEVICE INCLUDING A PIP CAPACITOR AND A MOS TRANSISTOR

FIELD OF THE INVENTION

The present invention relates to a method for manufacturing a semiconductor device; and, more particularly, to a method for fabricating a semiconductor device including a polysilicon insulator polysilicon (hereinafter referred to as "PIP") capacitor and a metal oxide semiconductor (hereinafter referred to as "MOS") transistor.

DESCRIPTION OF RELATED ART

In general, a PIP capacitor and a MIM capacitor are used in an analog circuit of a semiconductor device, e.g., a complementary metal oxide semiconductor (CMOS) logic circuit. Because such capacitors are independent of a bias unlike a MOS capacitor or a junction capacitor, high accuracy is required therein. Among these capacitors, the PIP capacitor is widely used for noise protection or frequency modulation. The PIP capacitor includes a lower electrode, a dielectric film, an upper electrode, and metal lines, which are connected to the lower electrode or the upper electrode through contacts, thereby electrically connecting the PIP capacitor to other elements. As semiconductor devices become highly integrated, a semiconductor device including the PIP capacitor and the MOS transistor has been proposed.

Figure 1:
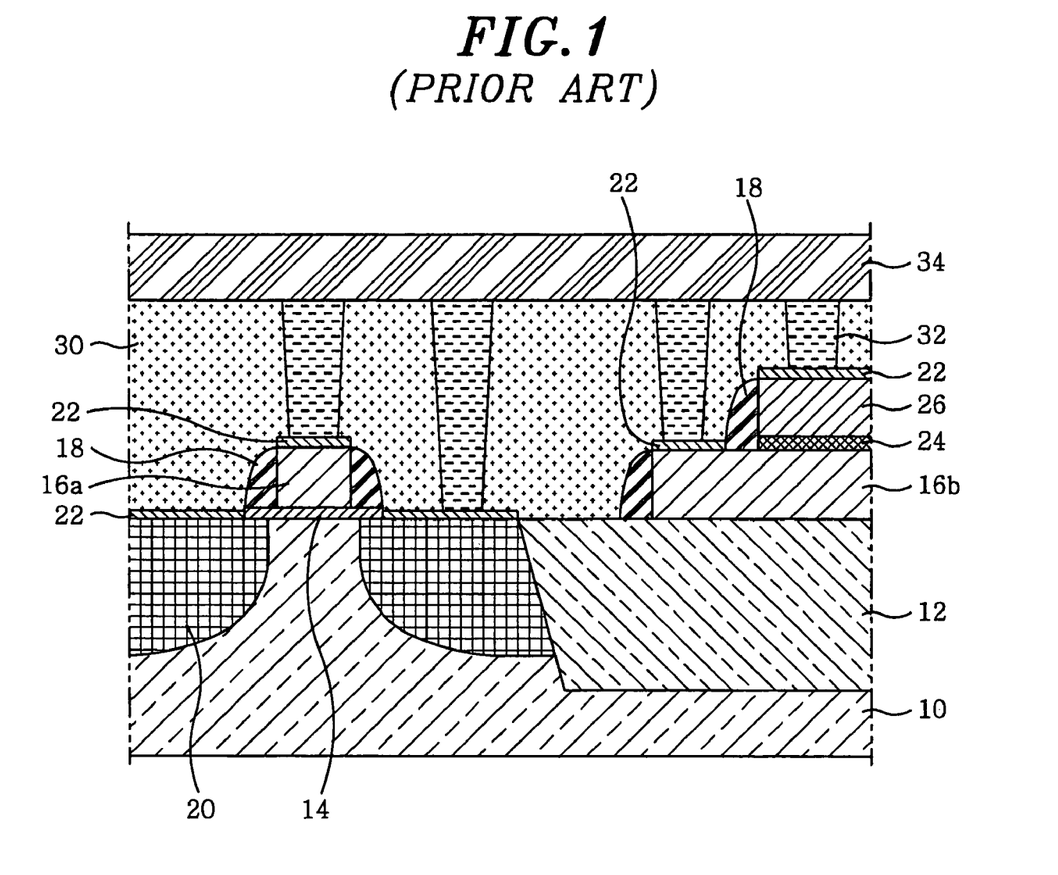
FIG. 1 illustrates a cross sectional view of a conventional structure of a semiconductor device including a PIP capacitor and an MOS transistor.

FIG. 1 illustrates a cross sectional view of a conventional structure of the semiconductor device including the PIP capacitor and the MOS transistor. Referring to FIG. 1, a lower electrode 16b of a first polysilicon film, a dielectric film 24 and an upper electrode 26 of a second polysilicon film are sequentially deposited on an isolator film 12 formed in a semiconductor substrate 10. After sequentially depositing a gate insulation film 14 and a gate electrode 16a on the semiconductor substrate 10 between the isolator films 12, a source/drain region 20 is formed into the semiconductor substrate. The source and the drain of the source/drain region 20 are separated from each other by the gate electrode 16a, thereby forming the MOS transistor.

Spacers 18, made of an insulation material, are formed on the sidewalls of the upper electrode 26, the insulator film 24 and the lower electrode 16b. Also, the spacers 18 are formed on sidewalls of the gate electrode 16a of the MOS transistor. Silicide films 22 are formed on the top surfaces of the lower electrode 16b and the upper electrode 26 of the PIP capacitor, the gate electrode 16a of the MOS transistor and the source/drain region 20, such that a contact resistance may be decreased. After depositing an interlayer insulation film 30 on an entire surface of a resultant structure in which the PIP capacitor and the MOS transistor are formed, contacts 32 are then formed in the interlayer insulation film 30. Thereafter, metal lines 34 are formed so as to connect the lower electrode 16b, the upper electrode 26, the gate electrode 16a and the source/drain region 20 to each other through the contacts 32.

In a conventional semiconductor device, the gate electrode 16a of the MOS transistor and the lower electrode 16b of the PIP capacitor are simultaneously formed by patterning the first polysilicon film. However, due to the existence of a step or height difference between the PIP capacitor region and the MOS transistor region, it is desirable to form the contact holes in several steps.

That is, in a conventional semiconductor device, the gate electrode 16a of the MOS transistor and the lower electrode 16b of the PIP capacitor have substantially the same height such that there is no selectivity difference in the contact hole formation process. However, due to a height difference between the source/drain region 20 and the upper electrode 26 of the PIP capacitor, it may not be possible to form all of the contact holes at once, or with a single etch step.

Accordingly, the same etch process is performed several times due to the existence of this step or height difference between the PIP capacitor region and the MOS transistor region. This results in an increase in the number of process manufacturing steps, a deterioration of the semiconductor device yield and an increase in manufacturing costs.

SUMMARY OF THE INVENTION

It is, therefore, an aspect of the present invention to provide a method for manufacturing a semiconductor device including a PIP capacitor and a MOS transistor, wherein the capacitor region and the transistor region have substantially the same height. This is achieved in an embodiment of the present invention by growing an active region of a semiconductor substrate to a height greater than that of the lower electrode of the PIP capacitor with a selective epitaxial silicon process. In that way, the number of process steps is decreased and the yield of the semiconductor device is increased.

In accordance with an embodiment of the present invention, there is provided a method for fabricating a semiconductor device including a polysilicon insulator polysilicon (PIP) capacitor and a metal oxide semiconductor (MOS) transistor, including:

depositing an isolator film on a semiconductor substrate;

etching the isolator film to expose an active region of the semiconductor substrate;

forming an epitaxial film on the exposed active region by performing a selective epitaxial silicon growth process thereon;

sequentially depositing a first polysilicon film, a dielectric film and a second polysilicon film on a entire surface of the isolator film and the epitaxial film;

forming an upper electrode by patterning the second polysilicon film, wherein a portion of the dielectric film located below the upper electrode is remained;

forming a lower electode and a gate electrode by patterning the first polysilicon film of the capacitor region and the transistor region, respectively;

forming a source/drain region in an upper portion of the epitaxial film, the source/drain region comprising a source region separated from a drain region by the gate electrode;

depositing an interlayer insulation film on a resultant structure and forming contact holes in the interlayer insulation film; and forming contacts connected to the upper electrode, the lower electrode, the gate electrode and the source/drain region.

In yet another embodiment of the present invention there is provided a method for fabricating a semiconductor device including a polysilicon insulator polysilicon (PIP) capacitor and a metal oxide semiconductor (MOS) transistor, including:

forming an isolator film on a semiconductor substrate;

etching the isolator film to expose an active region of the semiconductor substrate;

forming a silicon film on the exposed active region;

sequentially depositing a first polysilicon film, a dielectric film and a second polysilicon film on an entire surface of the isolator film and the silicon film;

forming an upper electrode in the second polysilicon film; and forming a lower electode and a gate electrode in the first polysilicon film on the isolator film and the silicon film, respectively.

In another embodiment of the present invention there is provided a semiconductor device comprising a polysilicon insulator polysilicon (PIP) capacitor and a metal oxide semiconductor (MOS) transistor fabricated according to a method, including:

forming an isolator film on a semiconductor substrate;

etching the isolator film to expose an active region of the semiconductor substrate;

forming a silicon film on the exposed active region;

sequentially depositing a first polysilicon film, a dielectric film and a second polysilicon film on an entire surface of the isolator film and the silicon film;

forming an upper electrode in the second polysilicon film; and forming a lower electode and a gate electrode in the first polysilicon film on the isolator film and the silicon film, respectively.

In yet another embodiment of the present invention there is provided a semiconductor device formed on a semiconductor substrate, including:

a polysilicon insulator polysilicon structure including an upper electrode and a lower electrode, the structure being assembled on an isolator film formed on a semiconductor substrate; and a metal oxide semiconductor structure including a gate, the semiconductor structure being assembled on a silicon film formed on the semiconductor substrate, wherein a thickness of the silicon film is greater than a thickness of the isolator film.

BRIEF DESCRIPTION OF THE DRAWINGS

The above and other aspects and features of the present invention will now be described with reference to embodiments of the present invention given in conjunction with the accompanying drawings, in which.

DETAILED DESCRIPTION

An embodiment of the present invention will now be described in detail with reference to the accompanying drawings, wherein like reference numerals appearing in the drawings represent like parts.

Figure 3A:
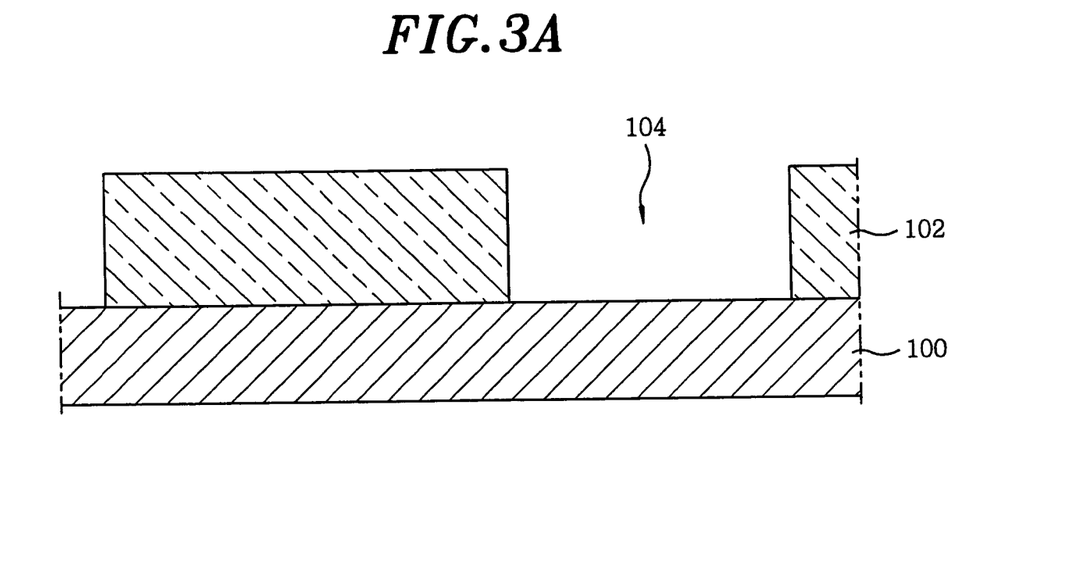
FIGS. 3A to 3I depict cross sectional views sequentially showing a process of fabricating a semiconductor device including a PIP capacitor and a MOS transistor in accordance with an embodiment of the present invention.

Referring to FIG. 3A, an isolator film 102 is formed on a semiconductor substrate 100 and an opening 104 is formed in film 102 to expose an active region of the semiconductor substrate 100. At this time, a tetraetylorthosilicate (TEOS) layer of about 5000~6000 Å, acting as an insulator material, is deposited on the semiconductor substrate 100. Next, a photoresist is deposited on the TEOS layer. Thereafter, the photoresist is exposed and developed using a reverse trench mask to form a photoresist pattern defining an active region and a nonactive region of the semiconductor substrate. The TEOS layer is then etched with a dry etching process using the photoresist pattern as a mask, thereby exposing the active region 104 for the MOS transistor. After etching the TEOS layer, the photoresist is removed.

Figure 3B:
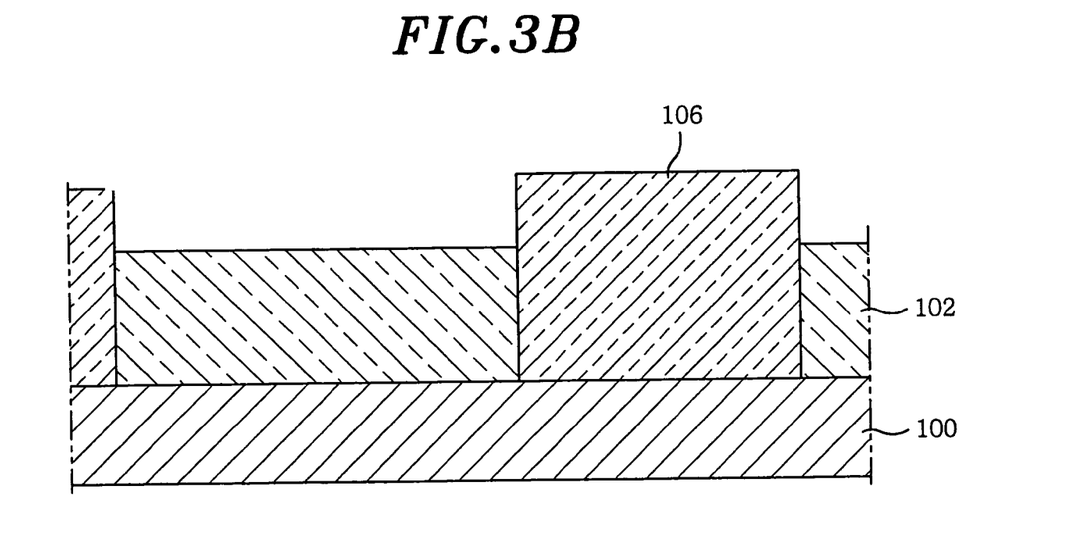

As shown in FIG. 3B, an epitaxial film 106 is formed by performing a selective epitaxial silicon growth process on the active region 104 of the semiconductor substrate 100. In the embodiment of the present invention shown in FIG. 3B, the thickness of the epitaxial film 106 is greater than that of the isolator film 102. In an embodiment of the invention, the epitaxial film 106 is grown to a height, relative to the substrate 100, that is substantially similar to that of the first polysilicon film 110 or the dielectric film 112 to be deposited. In that way, there is no step or height difference between the PIP capacitor region and the MOS transistor region.

Figure 3C:
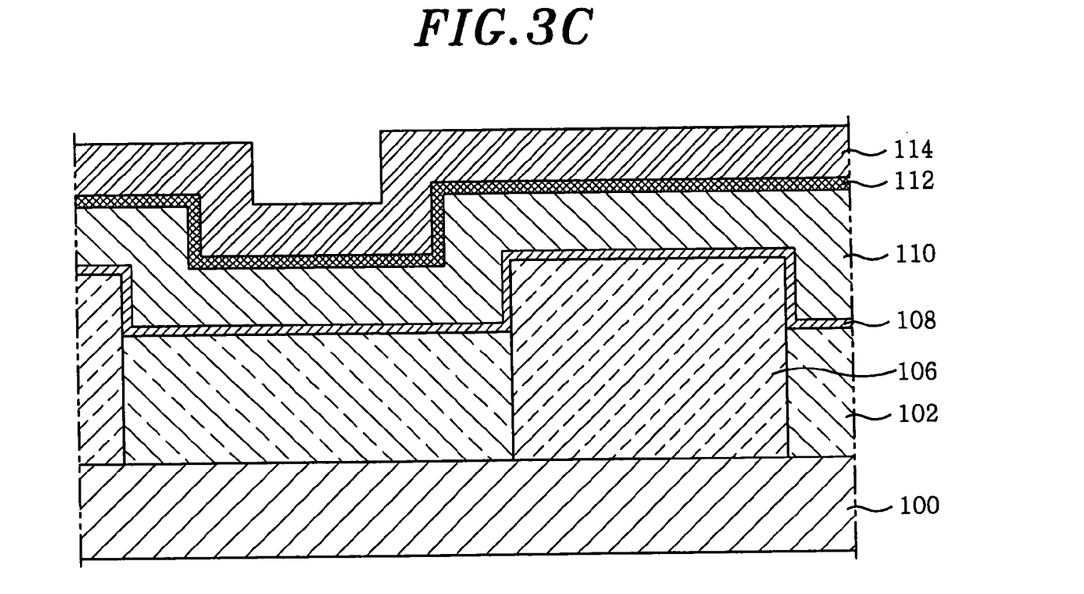

Subsequently, referring to FIG. 3C, a $SiO_2$ film 108, acting as an insulation thin film, is deposited on the entire surface of the isolator film 102 and the epitaxial film 106. Then, the first polysilicon film 110, the dielectric film 112 and a second polysilicon film 114 are sequentially deposited thereon.

Figure 3D:
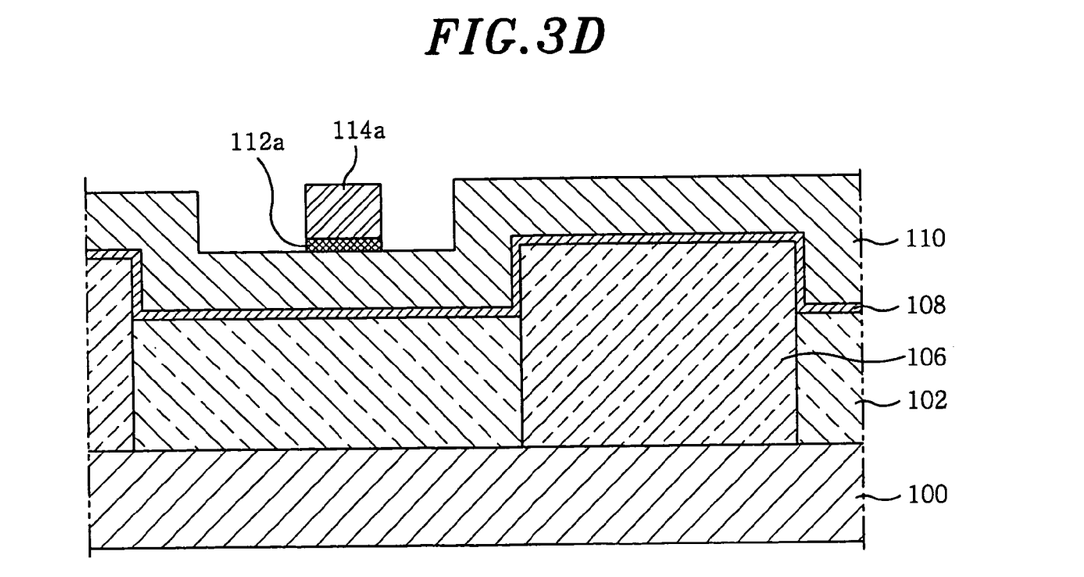

Next, by patterning the second polysilicon film 114 and the dielectric film 112, an upper electrode 114a of the PIP capacitor and a patterned dielectric film 112a are formed, as shown in FIG. 3D.

Figure 3E:
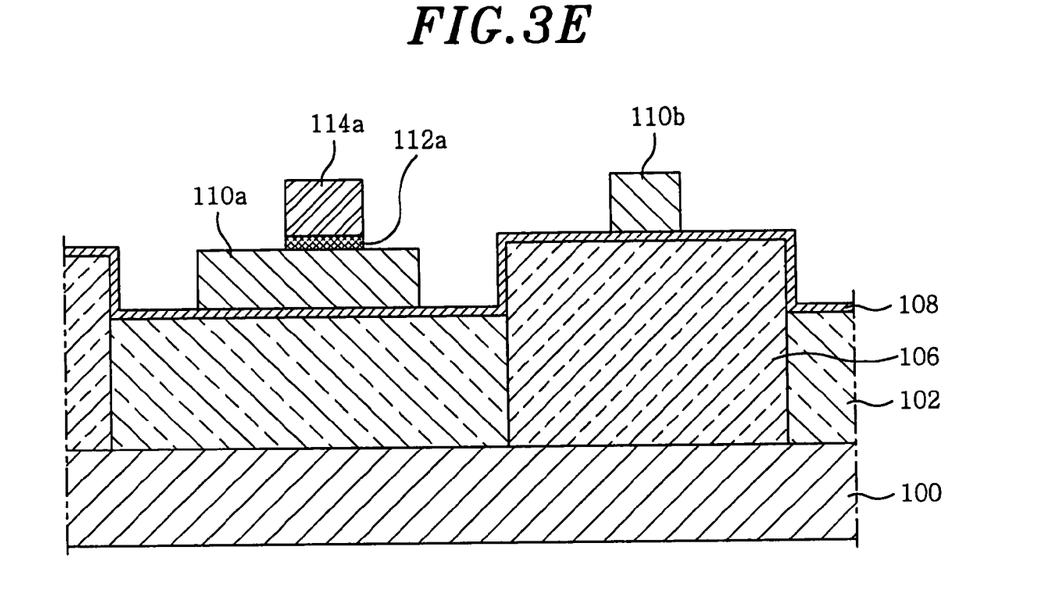

As shown in FIG. 3E, a lower electrode 110a of the PIP capacitor and a gate electrode 110b of the MOS transitor are simultaneously formed by patterning the first polysilicon film 110. At this time, because the thickness of the epitaxial film 106 formed, by the selective epitaxial silicon growth process, on the active region of the semiconductor substrate is greater than that of the isolator film 102, a step between the lower electrode 110a of the PIP capacitor formed on the isolator film 102 and the gate electrode 110b formed on the epitaxial film 106 is formed. In such a process, the upper electrode 114a of the PIP capacitor and the gate electrode 110b of the MOS transistor have about same height, thereby removing the step or height difference between the PIP capacitor region and the MOS transistor region.

Although not shown in the drawings, a lightly doped drain (LDD) region may be formed by performing an LDD ion implantation process on the epitaxial film 106 of the MOS transistor.

Figure 3F:
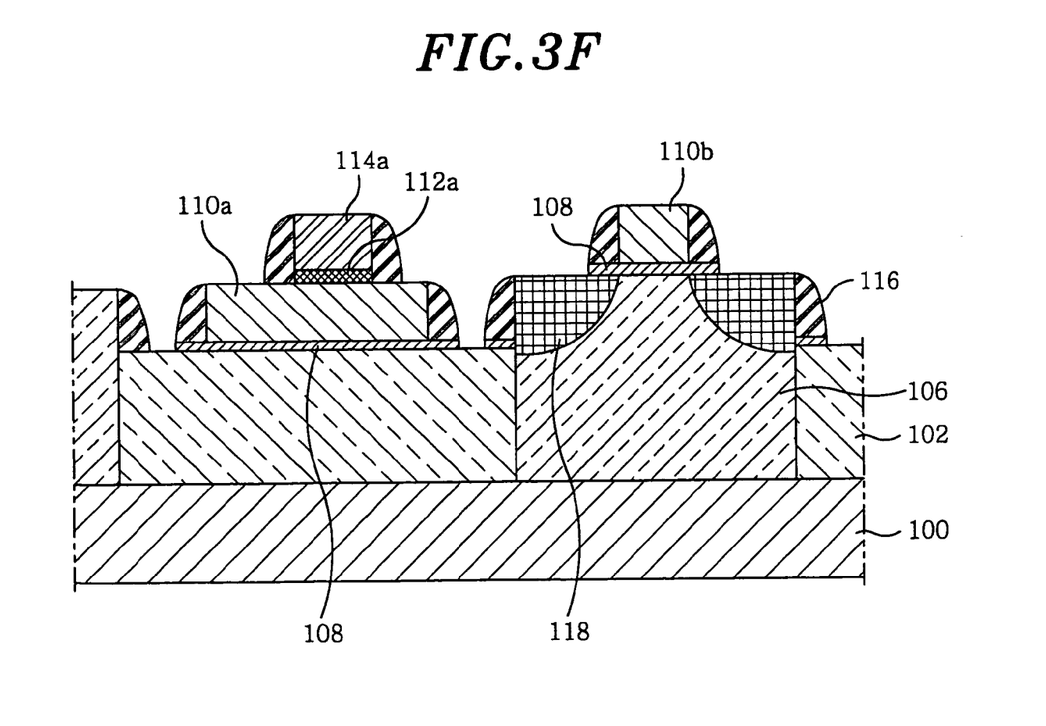

Referring to FIG. 3F, after forming an insulation thin film made of, e.g., $Si_3N_9$, on the resultant structure, a dry etching process is performed thereon, thereby forming spacers 116 on the sidewalls of the upper electrode 114a, the dielectric film 112a and the lower electrode 110a. In the embodiment of the present invention shown in FIG. 3F, the spacers 116 are simultaneously formed on the sidewalls of the gate electrode 110b and the epitaxial film 106 of the MOS transistor. The source and the drain of a source/drain region 118, separated from each other by the gate electrode 110b, are formed in the epitaxial film 106 by performing a source/drain ion implantation process on the MOS transistor region. The exposed $SiO_2$ layer 108 is then removed.

Figure 3G:
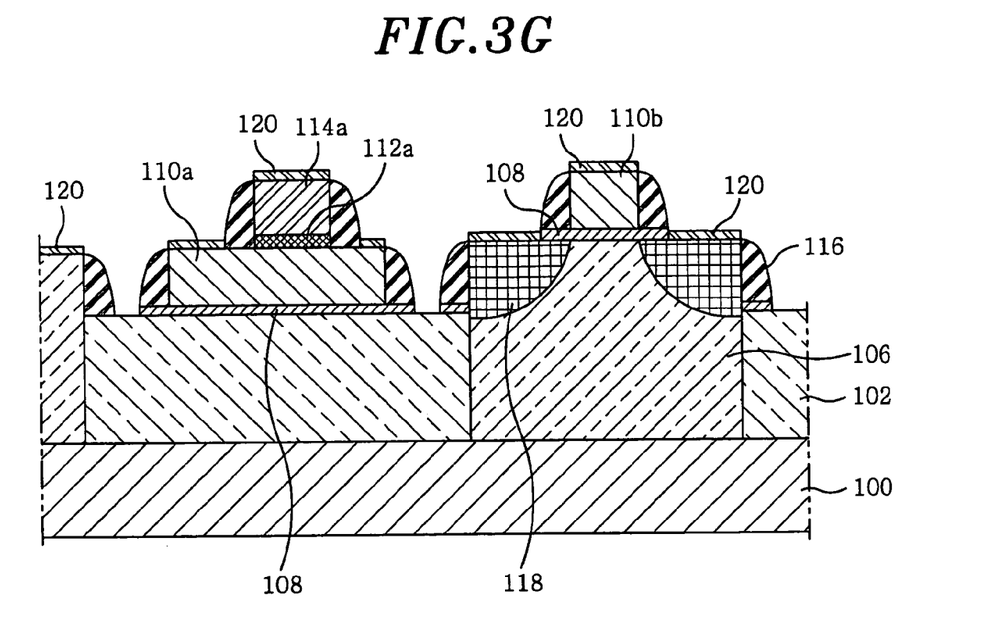

As shown in FIG. 3G, a silicide material, e.g., Ti, is deposited on the resultant structure and subsequently annealed to form silicide films 120 on the surfaces of the upper electrode 114a, the lower electrode 110a, the gate electrode 110b and the source/drain region 118. Next, the remaining silicide material, which has not been transformed into silicide film, is removed Referring to FIG. 3H, borophospho silicate glass (BPSG), phospho silicate glass (PSG) or undoped silicate glass (USG), acting as an interlayer insulation film 122, is deposited on the resultant structure. The interlayer insulation film 122 is then planarized by a chemical mechanical polishing (CMP) process. Next, contact holes 121 are formed into the interlayer insulation film 122 by performing a dry etching process, thereby exposing the silicide films on top of the upper electrode 114a, the lower electrode 110a, the gate electrode 110b and the source/drain region 118. In that way, the process for forming the contact holes can be performed in only one time because the step or height difference between the PIP capacitor region and the MOS transistor region is almost zero.

Figure 3H:
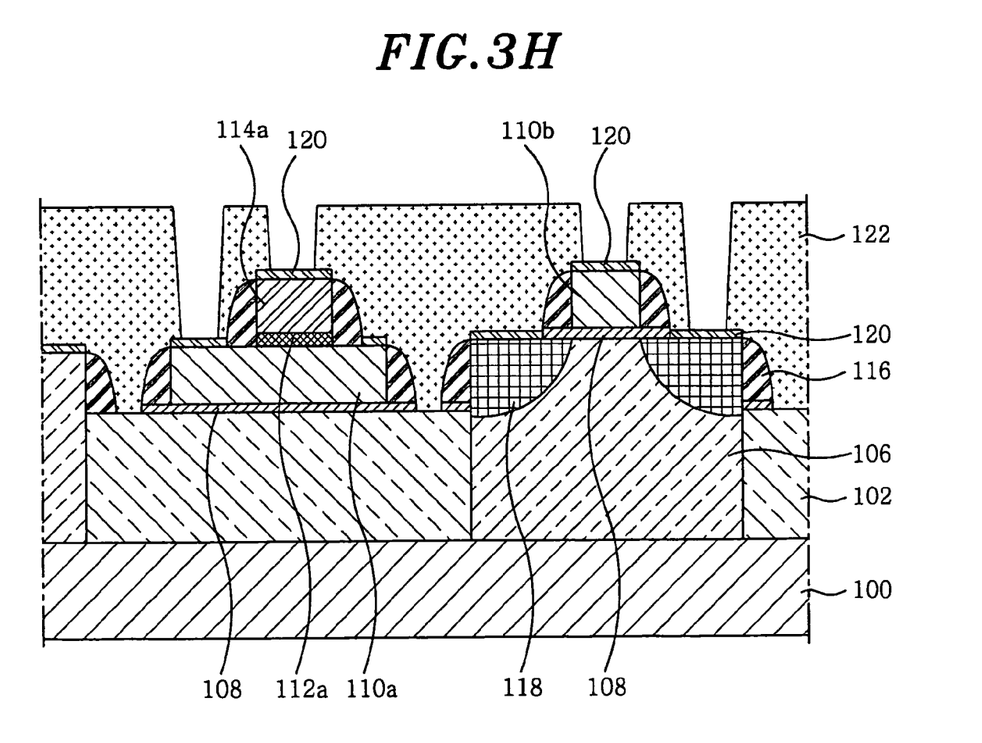

In an embodiment of the invention, an antireflective coating (ARC) film (not shown) may additionaly be deposited on the entire surfaces of a resultant structure before forming the interlayer insulation film 122 in order to efficiently control the contact hole etching process. As the etch rate of the interlayer film 122 is higher than the etch rate of the ARC, the etch process may be rendered selective towards the ARC.

Figure 3I:
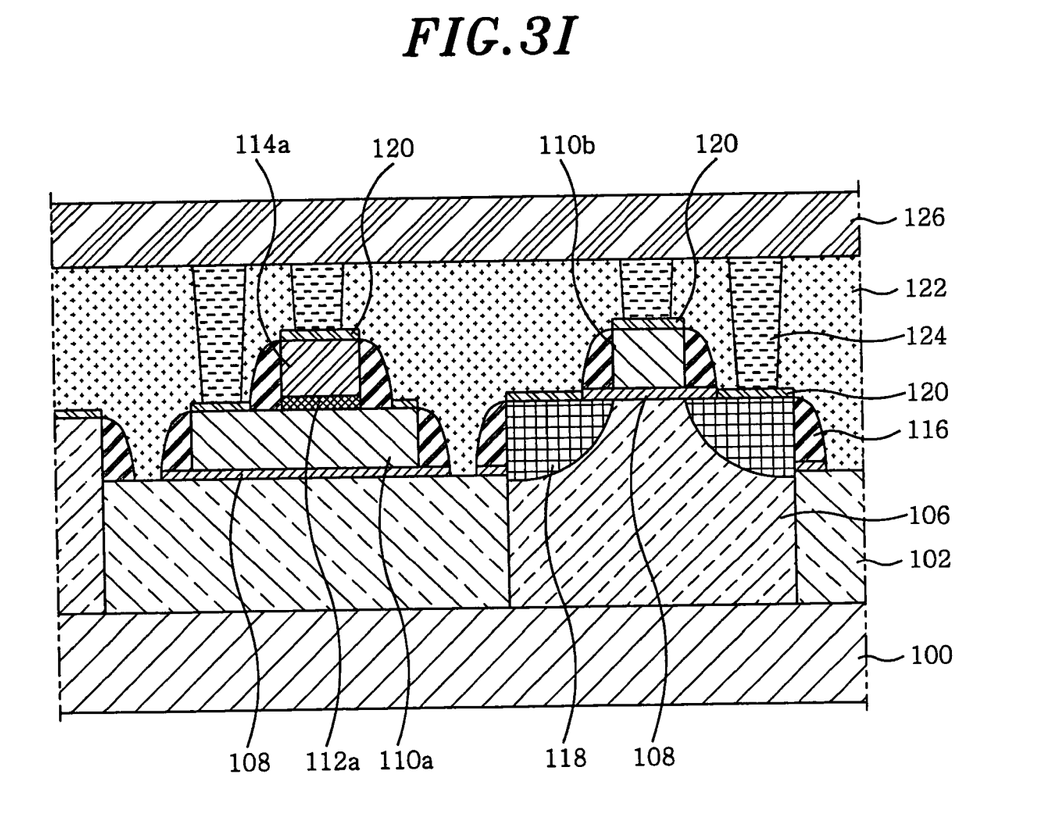

In FIG. 3I, contacts 124 are formed into the interlayer insulation film 122 and metal lines 126, connected to the contacts 124, are formed by performing a metal line process. The contacts 124 are connected to the upper electrode 114a, the lower electrode 110a, the gate electrode 110b and the source/drain region 118.

Figure 2:
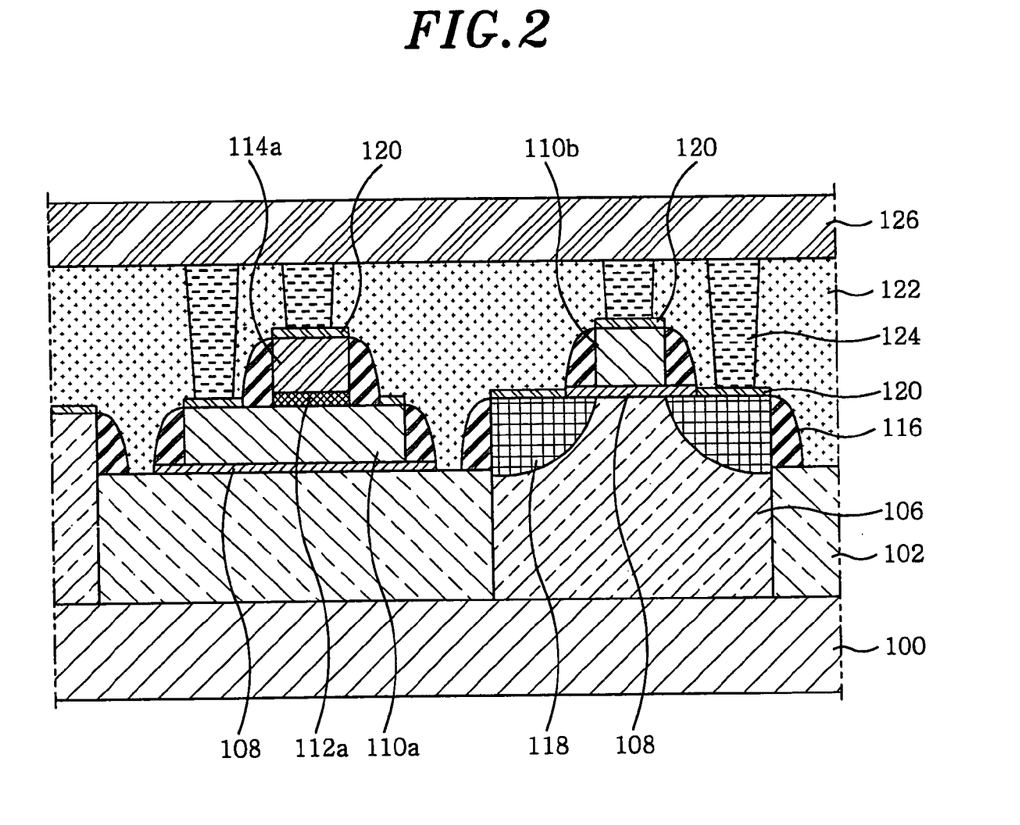
FIG. 2 shows a cross sectional view of a structure of a semiconductor device in accordance with an embodiment of the present invention.

Finally, the semiconductor device including the PIP capacitor and the MOS transistor is formed as shown in FIG. 2.

In accordance with the process of the present invention, the step or height difference between the PIP capacitor region and the MOS transistor region may be removed by growing the active region of the semiconductor substrate to the level of the lower electrode of the PIP capacitor with the selective epitaxial silicon process. In the present invention, the process for forming the contact holes is performed in only one time, thereby decreasing the number of process manufacturing steps and increasing the semiconductor device yield.

While the invention has been shown and described with respect to specific embodiments, it will be understood by those skilled in the art that various changes and modifications may be made without departing from the spirit and scope of the invention as defined in the following claims.

What is claimed is:

1. A method for fabricating a semiconductor device including a polysilicon insulator polysilicon (PIP) capacitor and a metal oxide semiconductor (MOS) transistor, comprising the steps of:
   depositing an isolator film on a semiconductor substrate;
   etching the isolator film to expose an active region of the semiconductor substrate;
   forming an epitaxial film on the exposed active region by performing a selective epitaxial silicon growth process thereon, wherein the epitaxial film has a thickness that is greater than the isolator film;
   sequentially depositing a first polysilicon film, a dielectric film and a second polysilicon film on an entire surface of the etched isolator film and the epitaxial film;
   forming an upper electrode of the capacitor on the etched isolator film by patterning the second polysilicon film and the dielectric film, wherein a portion of the dielectric film located below the upper electrode remains;
   forming a lower electrode of the capacitor and a gate electrode of the transistor by patterning the first polysilicon film on the etched isolator film and the epitaxial film, respectively;
   forming a source/drain region in an upper portion of the epitaxial film, the source/drain region including a source region separated from a drain region by the gate electrode;
   depositing an interlayer insulation film on a structure obtained at the step of forming the source/drain region and forming contact holes in the interlayer insulation film; and
   forming contacts connected to the upper electrode, the lower electrode, the gate electrode and the source/drain region,
   wherein the distance between a top surface of the substrate and a top surface of the epitaxial film is substantially identical to the distance between the top surface of the substrate and a top surface of the lower electrode of the capacitor.

2. The method of claim 1, further comprising a step of forming an insulation thin film on an entire surface of the etched isolator film and the epitaxial film after forming the epitaxial film.

3. The method of claim 1, further comprising a step of forming spacers on sidewalls of the upper electrode, the dielectric film, the lower electrode, the gate electrode and the epitaxial film after forming the lower electrode and the gate electrode.

4. The method of claim 1 further comprising a step of forming silicide films on the surfaces of the gate electrode, the source/drain region, the upper electrode and the lower electrode after forming the source/drain region.

5. The method of claim 1, further comprising a step of forming an antireflective coaxing (ARC) before forming the interlayer insulation film, such that a contact etching as selective towards the ARC.

6. The method of claim 1, further comprising a step of forming a lightly doped drain region on the epitaxial film of the exposed active region.

7. The method of claim 1, wherein the interlayer insulation film is one of borophospho silicate glass film, a phospho silicate glass film and a undoped silicate film.

8. The method of claim 1, wherein the step of forming the contract holes includes forming the contact holes with a single etch step.

9. A method for fabricating a semiconductor device including a polysilicon insulator polysilicon (PIP) capacitor and a metal oxide semiconductor (MOS)transistor, comprising the steps of:
   forming an isolator film on a semiconductor substrate;
   etching the isolator film to expose an active region of the semiconductor substrate;
   forming a silicon film on the exposed active region;
   sequentially depositing a first polysilicon film, a dielectric film and a second polysilicon film on an entire surface of the etched isolator film and the silicon film;
   forming an upper electrode of the capacitor on the etched isolator film in the second polysilicon film; and
   forming a lower electrode of the capacitor and a gate electrode in the first polysilicon film on the etched isolator film and the silicon film, respectively,
   wherein the distance between a top surface of the substrate and a top surface of the silicon film is substantially identical to the distance between the top surface of the substrate and a top surface of the lower electrode of the capacitor.

10. The method of claim 9, wherein the step of forming the silicon film includes forming a silicon film by epitaxy.

11. The method of claim 9, further comprising a step of connecting through an interlayer dielectric the gate, the upper electrode and the lower electrode with a single step etch process.

12. A semiconductor device comprising a polysilicon insulator polysilicon (PIP) capacitor and a metal oxide semiconductor (MOS) transistor fabricated according to a method comprising:

forming an isolator film on a semiconductor substrate;

etching the isolator film to expose an active region of the semiconductor substrate;

forming a silicon film on the exposed active region;

sequentially depositing a first polysilicon film, a dielectric film and a second polysilicon film on an entire surface of the etched isolator film and the silicon film;

forming an upper electrode of the capacitor on the etched isolator film in the second polysilicon film; and forming a lower electrode of the capacitor and a gate electrode of the transistor in the first polysilicon film on the etched isolator film and the silicon film, respectively, wherein the distance between a top surface of the substrate and a top surface of the silicon film is substantially identical to the distance between the top surface of the substrate and a top surface of the lower electrode of the capacitor.

* * * * *